United States Patent [19]
Crenshaw et al.

[11] Patent Number: 5,726,085
[45] Date of Patent: Mar. 10, 1998

[54] METHOD OF FABRICATING A DYNAMIC RANDOM ACCESS MEMORY (DRAM) CELL CAPACITOR USING HEMISPHERICAL GRAIN (HSG) POLYSILICON AND SELECTIVE POLYSILICON ETCHBACK

[76] Inventors: Darius Lammont Crenshaw, 3300 W. Park Blvd., Apt. 2242, Plano, Tex. 75075; Rick L. Wise, 604 Post Oak Dr., Plano, Tex. 75025; Jeffrey McKee, 1517 Laguna Vista Way, Grapevine, Tex. 76051

[21] Appl. No.: 401,740

[22] Filed: Mar. 9, 1995

[51] Int. Cl.$^6$ ............................................. H01L 21/8242
[52] U.S. Cl. ..................... 438/255; 438/398; 438/735
[58] Field of Search ....................... 437/47, 52, 60, 437/233, 919, 977; 438/253, 254, 255, 735

[56] References Cited

U.S. PATENT DOCUMENTS

| | | | |
|---|---|---|---|
| 5,134,086 | 7/1992 | Ahn | 437/52 |
| 5,204,280 | 4/1993 | Dhong et al. | 437/919 |
| 5,256,587 | 10/1993 | Jun et al. | 437/52 |
| 5,342,800 | 8/1994 | Jun | 437/60 |
| 5,350,707 | 9/1994 | Ko et al. | 437/52 |
| 5,387,531 | 2/1995 | Rha et al. | 437/919 |

FOREIGN PATENT DOCUMENTS

| | | |
|---|---|---|
| 43 21 638 A1 | 3/1994 | Germany. |
| 7122652 | 12/1995 | Japan. |

OTHER PUBLICATIONS

M. Sakao, N. Kasai, T. Ishijima, E. Ikawa, H. Watanbe, K. Tarada and T. Kikkawa; "*A Capacitor–Over–Bit–Line (COB) Cell With A Hemispherical–Grain Storage Node for 64 Mb DRAMs*"; IEDM 90, 1990 IEEE, pp. 655–658.

J.H. Ahn, Y. W. Park, J.H. Shin, S.T. Kim, S.P. Shim, S.W. Nam, W.M. Park, H.B. Shin, C.S. Choi, K.T. Kim, D. Chin, O.H. Kwon and C.G. Hwang; "*Micro Villus Patterning (MVP) Technology for 256Mb DRAM Stack Cell*"; 1992 Symposium on VLSI Technology Digest of Technical Papers; 1992 IEEE, pp. 12–13.

*Primary Examiner*—Tuan H. Nguyen
*Attorney, Agent, or Firm*—Jacqueline J. Garner; W. James Brady, III; Richard L. Donaldson

[57] ABSTRACT

A storage node 64 of a capacitor having increased charge storage capacity and a method for forming thereof. A doped polysilicon region 68 is formed. A thin layer of hemispherical grain polysilicon 70 is deposited over the doped polysilicon region 68. The doped polysilicon region 68 and the thin layer of hemispherical grain polysilicon 70 are etched using an etch chemistry that etches the doped polysilicon region 68 faster than the thin layer of hemispherical grain polysilicon 70 to increase the surface area of an upper surface 66 of the storage node 64.

15 Claims, 6 Drawing Sheets

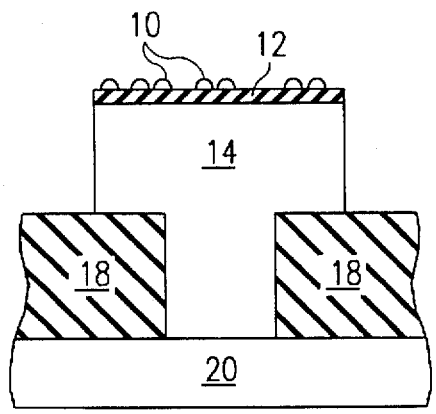
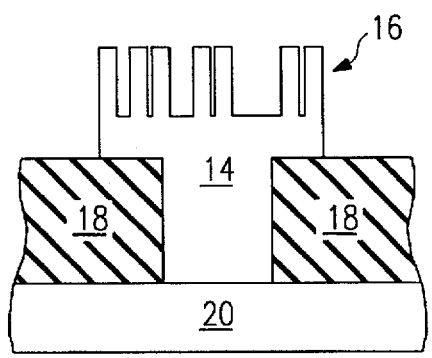
FIG. 1A
(PRIOR ART)
FIG. 1B
(PRIOR ART)
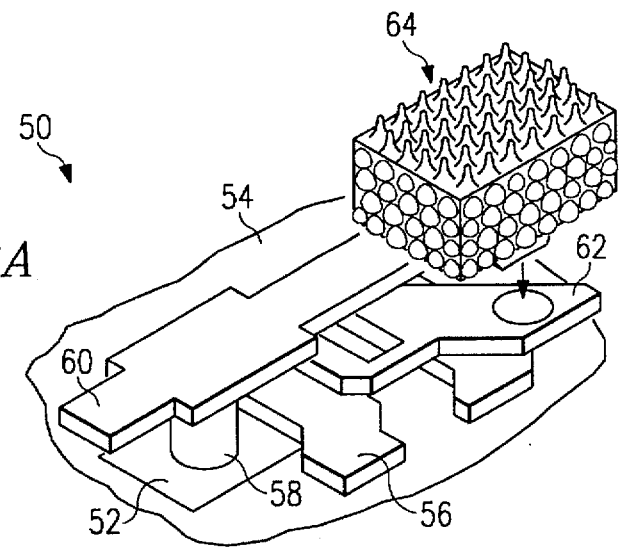
FIG. 2A
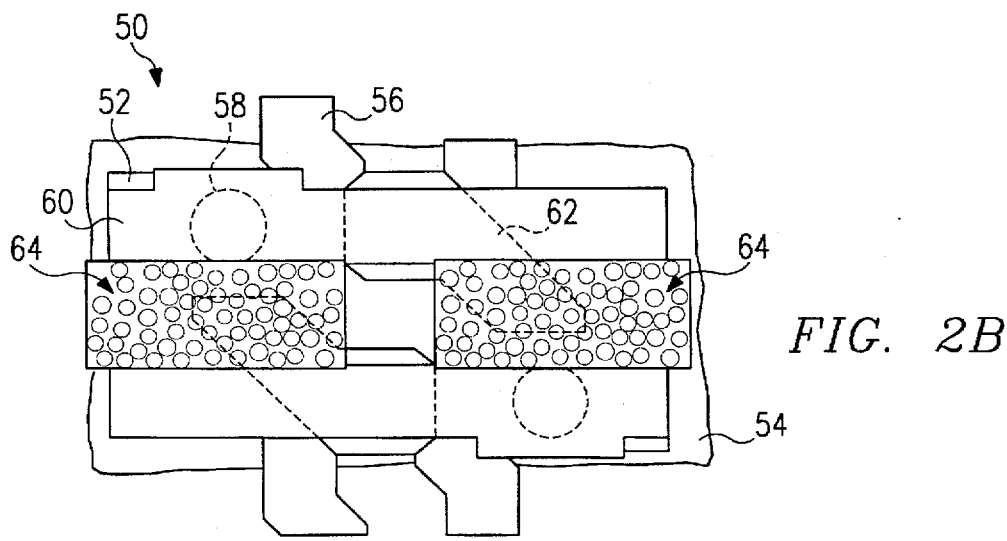
FIG. 2B

METHOD OF FABRICATING A DYNAMIC RANDOM ACCESS MEMORY (DRAM) CELL CAPACITOR USING HEMISPHERICAL GRAIN (HSG) POLYSILICON AND SELECTIVE POLYSILICON ETCHBACK

FIELD OF THE INVENTION

This invention generally relates to semiconductor processing and more specifically to storage capacitors for dynamic memories.

BACKGROUND OF THE INVENTION

The acquisition of sufficient charge-storage capacity in a small area is one of the most challenging design problems of Ultra Large Scale Integration (ULSI) Dynamic Random Access Memory (DRAM) technology. As the push for higher density DRAMs increases, the charge-storage device of each memory cell must physically fit into a smaller and smaller area. A moderate degree of success has been achieved through the use of cell structure innovations which increase the effective storage-node area beyond the amount allocated within each memory cell.

Several methods use hemispherical grain (HSG) polysilicon (i.e., rugged poly) to increase the charge storage capacity. HSG polysilicon, as deposited, enhances the surface area by a factor of 1.6–2.2. In one method, a thin layer of HSG polysilicon is deposited to produce a pseudo archipelago pattern (grain size and separation will not strictly be constant over the area of interest) with dimensions that are far smaller the those presently producible with current practical lithography tools. (Archipelago patterns with features less than 500 Å are possible with electron-beam lithography, but low throughput make this process unattractive.) The HSG polysilicon 10 is deposited on a thin CVD (chemical-vapor deposition) oxide layer 12 that rests on top of a thick doped polysilicon layer 14, as shown in FIG. 1a. The doped polysilicon layer 14 extends through oxide layer 18 to semiconductor body 20. An oxide etch, followed by a polysilicon etch produces a micro-villus pattern 16 as shown in FIG. 1b. A major problem with this approach is that area enhancement is due totally to the ability to form micro villi of high aspect ratio. The inability to strictly control the HSG polysilicon grain distribution threatens the manufacturability and reliability of such a structure. Thus, there is a need for surface area enhancement of charge-storage nodes that is easily manufacturable, repeatable, and reliable.

SUMMARY OF THE INVENTION

Generally, and in one form of the invention, a capacitor having increased storage node capacity and a method of forming such a capacitor are disclosed herein. A doped polysilicon storage node is formed at the surface of a semiconductor body. A thin layer of HSG polysilicon is then formed over the structure. The doped and HSG polysilicon are then etched using an etch chemistry that selectively etches the doped polysilicon faster that the HSG polysilicon. An etch ratio of at least 3:1 is preferred. The etch is anisotropic and does not remove the HSG polysilicon from the sidewalls of the storage node. As a result, U-shaped grooves are formed in the upper surface of the doped polysilicon storage node which increases the surface area of the storage node, and thus increase the charge storage capacity.

An advantage of the invention is providing a capacitor having increased storage capacity.

A further advantage of the invention is providing a charge storage node having increased surface area.

A further advantage of the invention is providing a charge storage node having increased surface area that is highly reproducible, reliable and easily fabricated.

These and other advantages will be apparent to those of ordinary skill in the art having reference to the specification in conjunction with the drawings.

BRIEF DESCRIPTION OF THE DRAWINGS

In the drawings:

FIGS. 1a–1b are cross-sectional views of a prior art charge storage node;

FIGS. 2a–2b are perspective and layout views, respectively, of a DRAM cell according to the invention;

Corresponding numerals and symbols in the different rises refer to corresponding parts unless otherwise indicated.

DETAILED DESCRIPTION OF PREFERRED EMBODIMENTS

Figure 3:
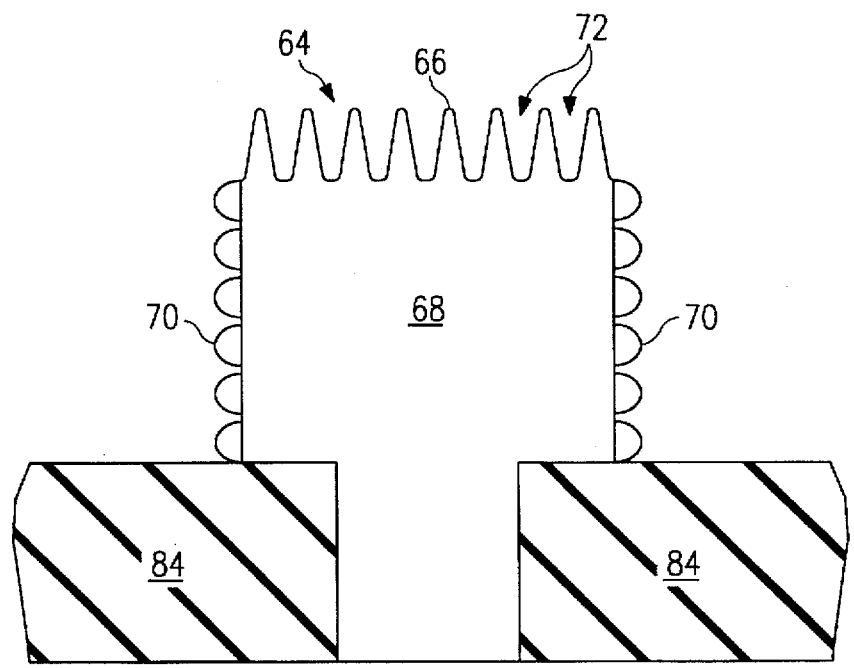
FIG. 3 is a cross-sectional view of a charge storage node according to the invention.

The invention will be described in conjunction with a charge storage node for a DRAM memory cell. However, it will be apparent to those skilled in the art that the invention is applicable to many technologies desiring increased storage capacity in a small area.

One embodiment of a DRAM cell using a charge storage node according to the invention is shown in FIGS. 2a–b. DRAM cell 50 is a capacitor over bitline (COB) type cell. Active area 52 is formed in substrate 54. Wordline 56 extends over active area 52 to fore the gate of a transistor. Contact 58 connects bitline 60 to active area 52 on one side of wordline 56. A local interconnect 62 is used to connect charge storage node 64 to active area 52 on the other side wordline 56. With the exception of charge storage node 64, DRAM cell 50 is a conventional DRAM cell and operates in a conventional manner.

Charge storage node 64 has increased surface area on the upper surface 66, as shown in detail in FIG. 3. Charge storage node 64 includes a doped polysilicon region 68 and a thin layer of HSG polysilicon 70 on the sidewalls of the doped polysilicon region 68. HSG polysilicon layer 70 increases the surface area on the sidewalls of charge storage node 64 by a factor on the order of 1.6 to 2.5. None of the originally deposited HSG polysilicon is located on the upper surface 66 of charge storage node 64. The upper surface 66 of charge storage node 64 has U-shaped grooves 72 which have a depth on the order of 0.1–0.3 microns. The U-shaped grooves 72 of upper surface 66 increase the surface area by a factor on the order of 3 or greater depending on the depth and average spacing of the U-shaped grooves 72.

The storage capacity of a capacitor is directly related to the effective surface area of the nodes or electrodes of the capacitor. Thus, increasing the surface area of charge storage node 64 increases the storage capacity of a capacitor formed with charge storage node 64 as the bottom electrode. This is extremely important for very dense devices, such as DRAMs, where the area allocated for charge storage capacity is very small. In addition, upper surface 66 avoids the problems of reliability, repeatability, and difficulty in manufacturing associated with high aspect ratio structures used in prior art techniques.

Figure 4A:
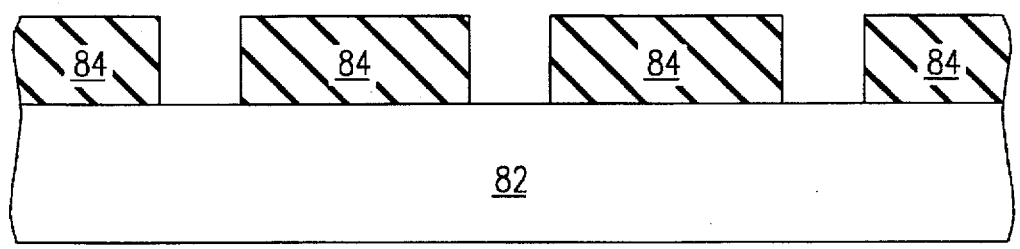
FIGS. 4a–4h are cross-sectional views of a charge storage node according to the invention at various stages of fabrication.

FIG. 4a shows a semiconductor body 82 having a dielectric layer 84 formed thereon. Dielectric layer 84 has been patterned and etched to remove the portions where a charge storage node 64 is to be formed. As is the case for COB cells, semiconductor body 82 may have active areas, bitlines, wordlines, and other structures (not shown) located therein. Typically, semiconductor body 82 will not yet include metal interconnect lines.

Figure 4B:
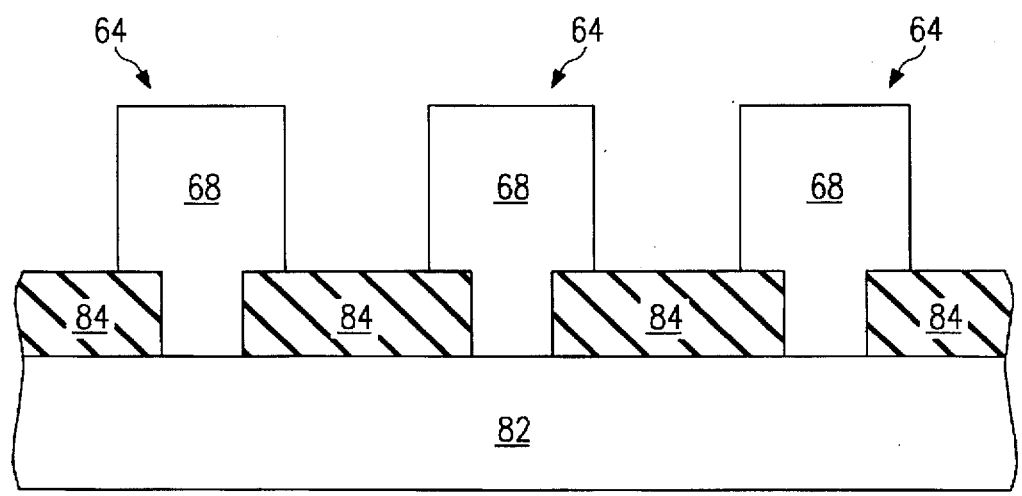

The formation of a charge storage node 64 into the structure of FIG. 4a according to the invention will now be described. A layer of polysilicon is deposited over the surface of the structure to a depth above dielectric layer 84 of 0.3–0.6 microns. Preferably, the polysilicon is insitu-doped (ISD) with phosphorous. However, the polysilicon may alternatively be doped after deposition and/or doped with alternative dopants. The doped polysilicon layer is then patterned and etched to form the doped polysilicon region 68 of charge storage node 64, as shown in FIG. 4b. The width and length of doped polysilicon region 68 will vary by design, but may typically be in the range of 0.3 to 1 micron each.

Figure 4C:
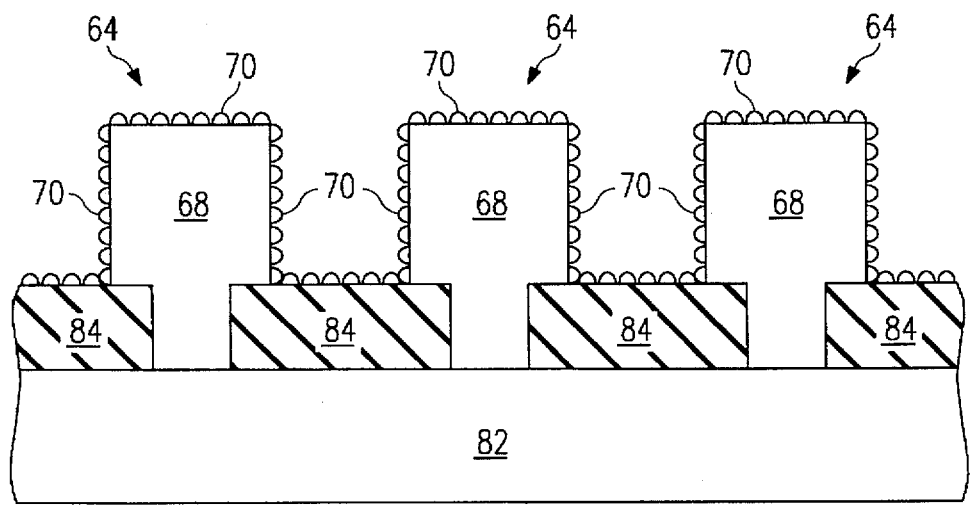

Next, a thin layer of HSG polysilicon 70 is deposited over the structure as shown in FIG. 4c. The HSG layer 70 should be thin enough to bring about surface area enhancement for the corresponding charge storage node 64 dimensions. For high density DRAM applications, surface area enhancement occurs when the grain size of the HSG polysilicon 70 is much less than the dimensions of the charge storage node 64. For thin HSG layers, the grain size and film thickness are usually on the same order of magnitude. A grain size and film thickness on the order of 500 Å is appropriate for 256 Mb DRAM applications having approximately a 0.25 µm² storage node cross-sectional area.

Typically, HSG polysilicon layer 70 is deposited via silane ($SiH_4$) deposition at the amorphous silicon/polysilicon transition temperature. However, other deposition techniques may alternatively be used. HSG polysilicon layer 70 is preferably undoped to maximize etch selectivity between the HSG polysilicon layer 70 and doped polysilicon region 68.

Figure 4D:
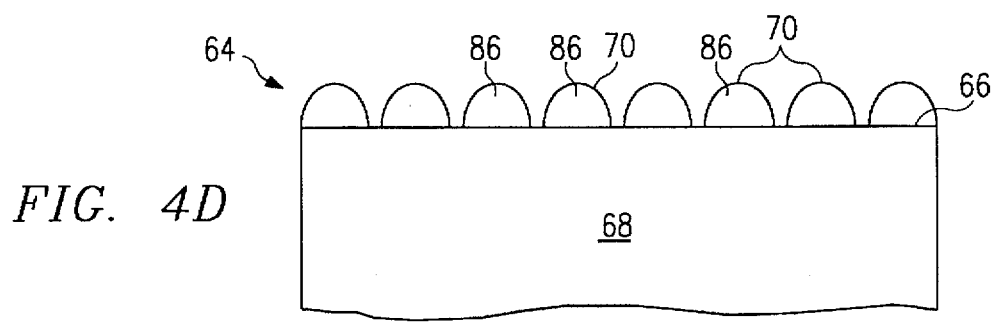

FIG. 4d shows an amplified view of the upper surface of charge storage node 64 after HSG polysfiicon 70 deposition. The average separation between HSG grains 86 is key to optimization of surface area enhancement. It is not favorable to have adjacent grains 86 in contact with one another. As will be explained further below, an average grain separation of 100–300 Å is desirable.

Next, a charge storage node etch is performed to enhance the surface area of the upper surface 66. The etch chemistry needs to be selective to doped polysilicon region 68 over undoped HSG polysilicon layer 70, such as a halogen based gas chemistry. An etch selectivity ratio of 3:1 or greater is desired. For example, an anisotropic etch using a $HBr/Cl_2$ etch-gas chemistry may be used. Etch process selectivity allows HSG polysilicon layer 70 to serve as an etch mask so that the degree of roughness of the original charge storage node surface (with HSG) may be amplified accordingly.

Figure 4E:
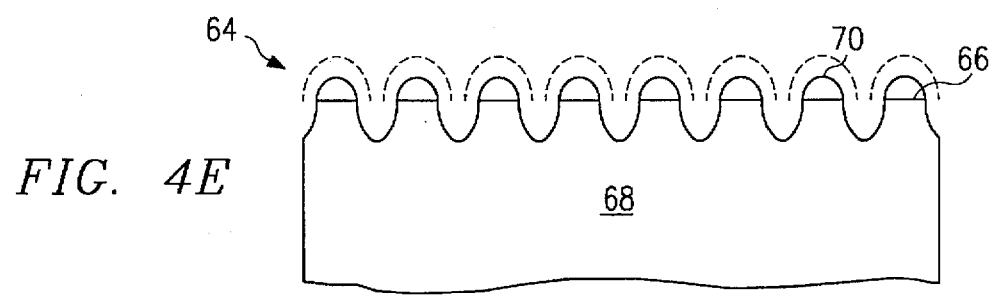
Figure 4F:
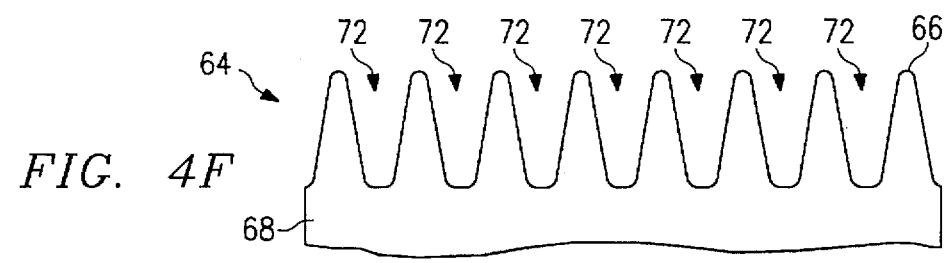

Referring to FIG. 4e, the doped polysilicon region 68 etches faster than the HSG polysilicon layer 70 causing grooves to be formed in the surface of the doped polysilicon region 68. The etch continues until all of the HSG polysilicon layer 70 is removed from the upper surface, as shown in FIG. 4f. This creates U-shaped grooves 72 in the upper surface having a depth on the order of 0.1–0.3. microns.

Figure 4G:
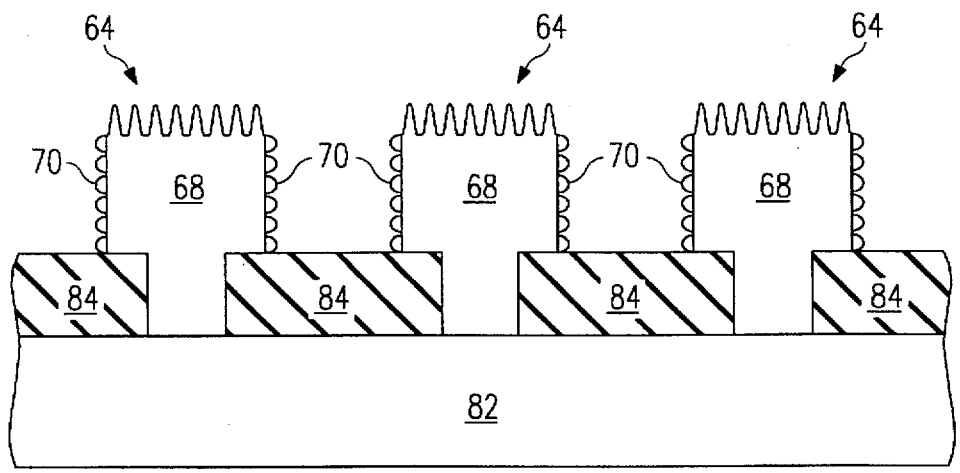

As shown in FIG. 4g, because the etch is anisotropic, the HSG polysilicon layer 70 remains on the sidewalls of charge storage node 64. However, all of the HSG polysilicon layer 70 between charge storage nodes 64 is removed from the surface of dielectric layer 84 during the charge storage node etch. This is necessary to electrically isolate the charge storage nodes 64 from each other.

Figure 4H:
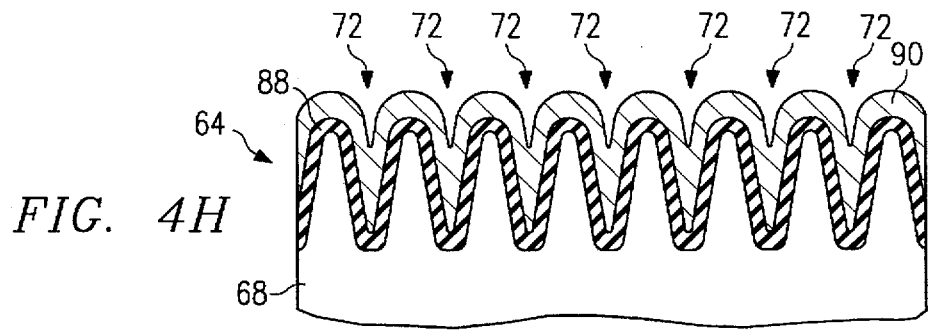

After the charge storage node etch, a dielectric layer is deposited, followed by the deposition of a polysilicon layer as shown in FIG. 4h. The dielectric layer may comprise an oxide-nitride-oxide tri-layer. In order to take advantage of the surface area enhancement, there must be enough room in the grooves 72 to accommodate both capacitor dielectric 88 and top capacitor electrode 90. Accordingly, the average HSG grain 86 separation before the charge storage node etch needs to be on the order of 150 Å or larger.

Figure 5A:
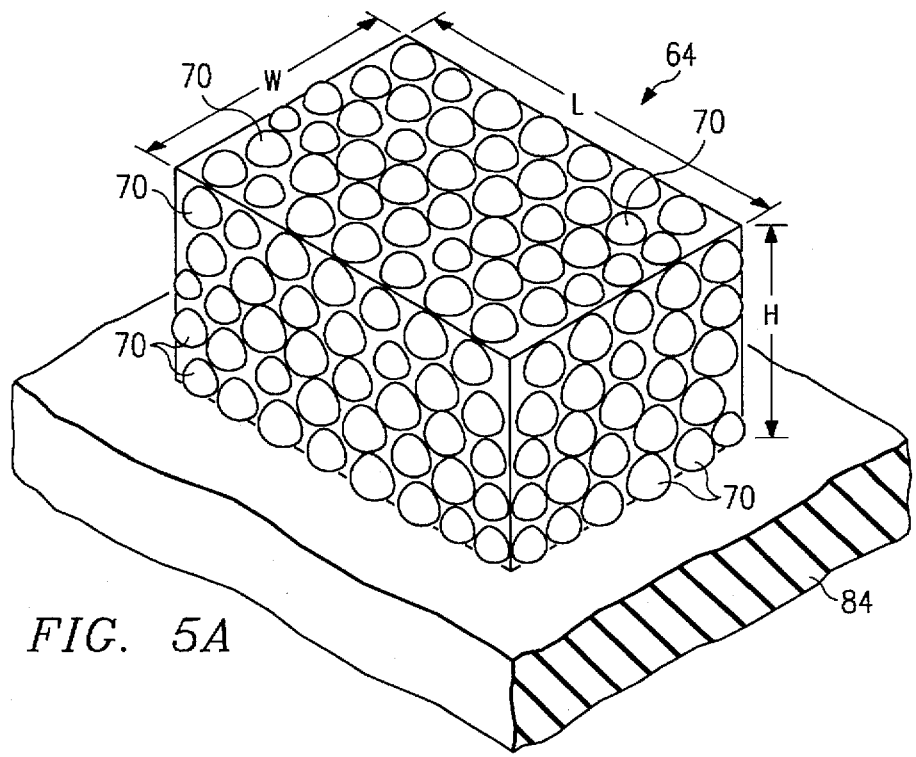
FIG. 5a is a perspective view of a charge storage node prior to HSG etchback.

FIG. 5a is a depiction of charge storage node 64 with dimensions approaching those needed for 256 Mb DRAM applications after deposition of thin HSG polysilicon layer 70 but prior to the etchback. $A_{top}$ and $A_{sw}$ are the area enhancement factors for the charge storage node 64's top surface and sidewalls, respectively. Before etchback, $A_{top}$ and $A_{sw}$ are identical. The total area enhancement factor, $A_{eff}$ is determined according to the following formula:

$$A_{eff} = \frac{A_{top}(w*L) + A_{sw}*2*H(w+L)}{(w*L) + (2H(w+L))}$$

Figure 5B:
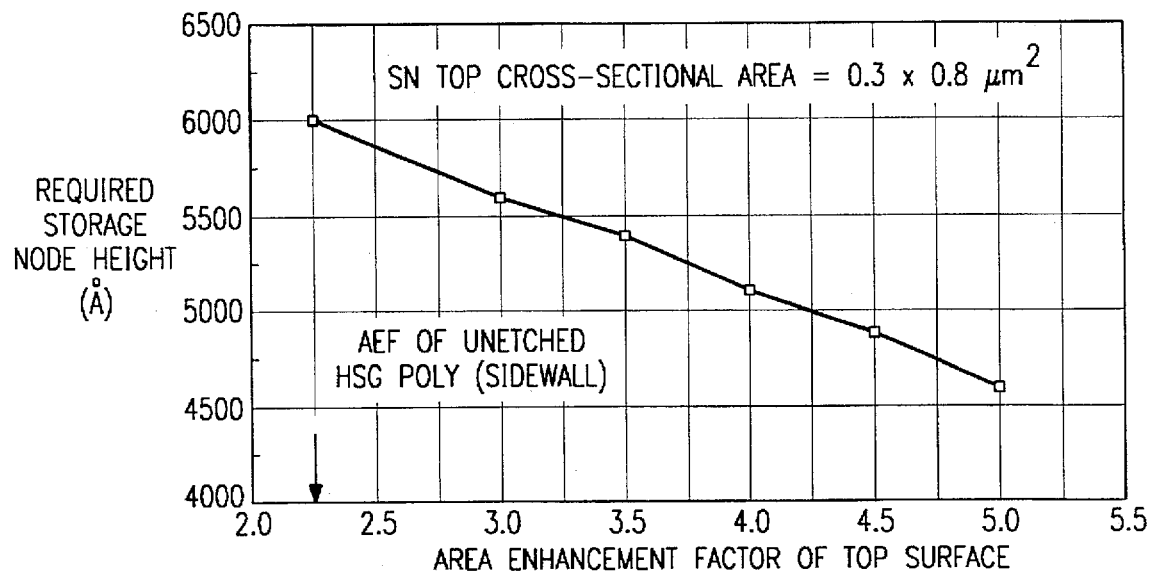
FIG. 5b is a graph of storage node height versus area enhancement factor.
Figure 5C:
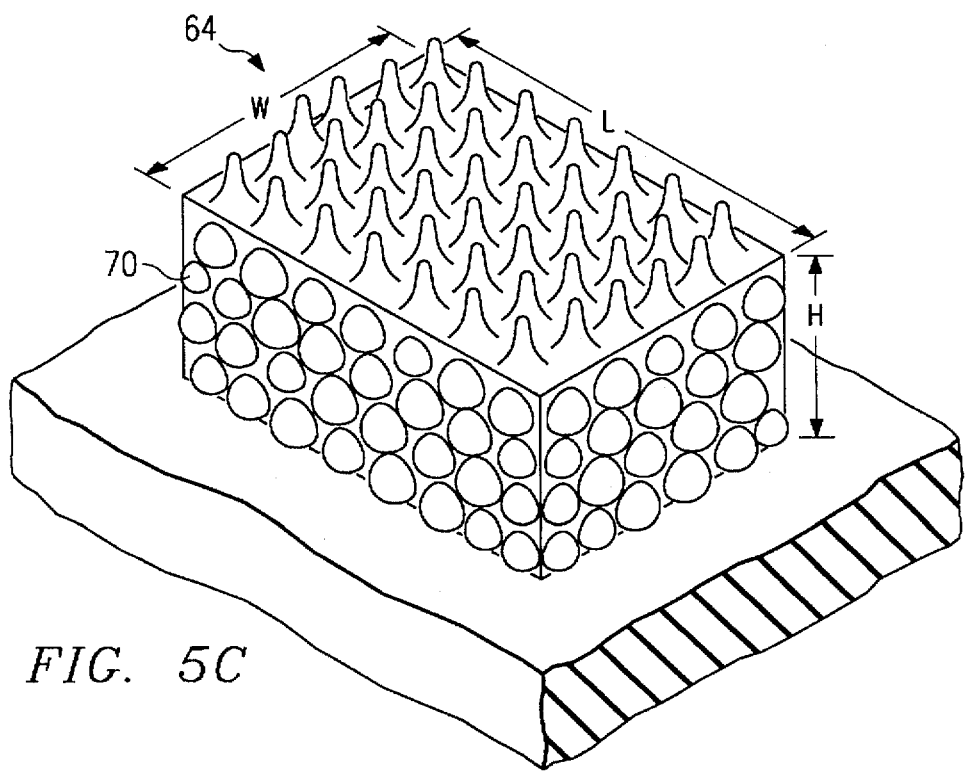
FIG. 5c is a perspective view of a charge storage node after HSG etchback.

Assuming that $A_{top}=A_{sw}=2.25$, w=0.3 µm, L=0.8 µm, and H=0.6 µm, $A_{eff}$ according to the above equation equals 2.25. After etchback, $A_{top}$ increases, while $A_{sw}$ remains the same. As $A_{top}$ increases, the height of the charge storage node 64 can be decreased while obtaining the same total effective area. FIG. 5b is a graph showing the relationship between the area enhancement factor of the top surface, $A_{top}$, and the height (H) which yields a constant value of total surface area. For example, if the area enhancement factor, $A_{top}$, increased to 4.2 (as a result of an etchback), the height (H) of charge storage node 64 could be reduced to 0.5 µm while obtaining the same total effective area as a 0.6 µm—storage node. This is shown in FIG. 5c. It should be noted that if a reduced height is not required, the final (post etchback) height could remain at 0.6 µm and the total effective area enhancement factor, $A_{eff}$ would increase to 2.55.

Figure 6:
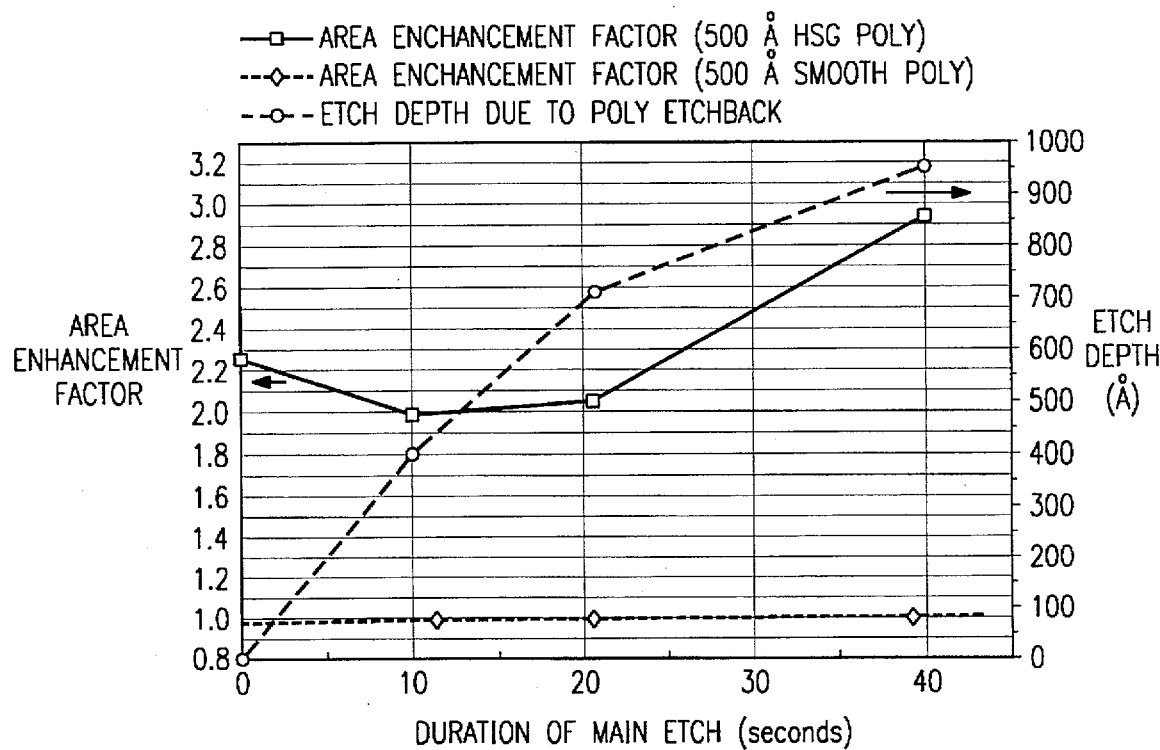
FIG. 6 is a graph of area enhancement factor and etch depth versus etch duration.

FIG. 6 is a graph of how the area enhancement factor (AEF) varies as a function of etch time using a $HBr/Cl_2$ etch-gas chemistry. Planar MIS-type capacitors were used to obtain this data. The AEF first decreases slightly before it begin to increase. This decrease can be traced to two causes. First, the etch begins with a brief (15 sec.) breakthrough stage which occurs in $CF_4$. This segment of the etch is more selective to the undoped HSG polysilicon layer. Therefore, surface roughness is lost during this portion of the etch and the actual starting point of the $HBr/Cl_2$ etch begins with an AEF closer to 2.0. Second, because the initial grain separation in this experiment was on the order or 100 Å, the valleys formed in the doped polysilicon portion are initially too narrow to accommodate both the capacitor dielectric layer and the top polysilicon electrode. As the main etch proceeds, the valleys become large enough to accommodate both the capacitor dielectric and top polysilicon electrode. FIG. 6 shows that after an etch duration of 40 seconds, an AEF of approximately 2.9 and an etch depth of approximately 940 Å are obtained in this example. FIG. 6 also shows that the AEF for a smooth polysilicon capacitor does not vary significantly with etch duration.

Figure 7:
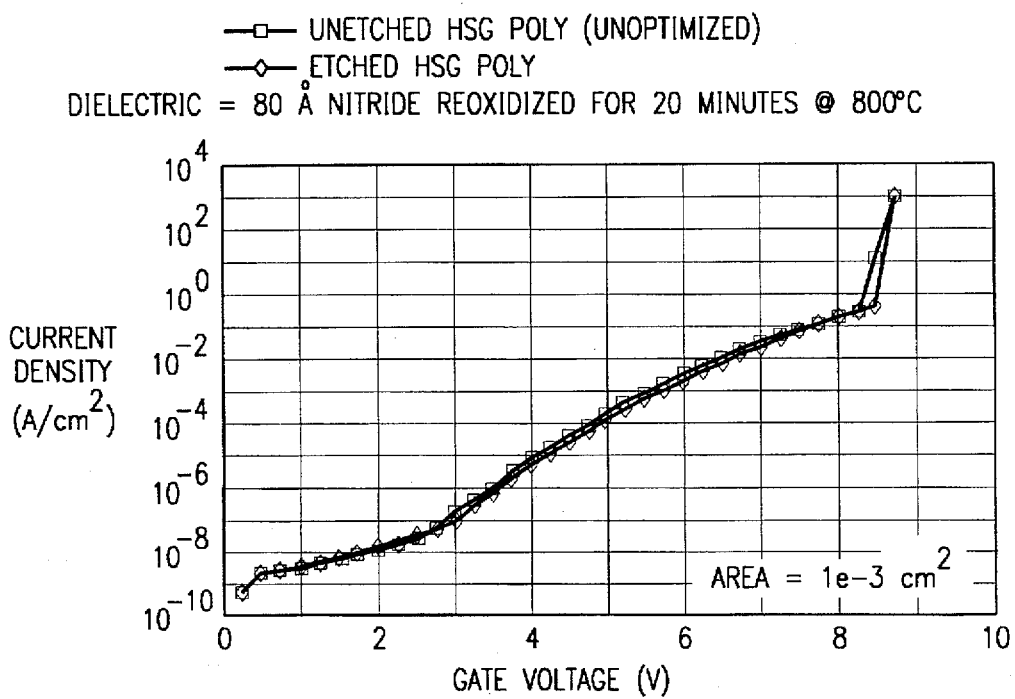
FIG. 7 is a graph of I–V characteristics comparing before and after etch leakage currents.

FIG. 7 is a plot of leakage current versus gate voltage for etched and unetched HSG polysilicon capacitors. As can be seen in FIG. 7, the charge storage node etch has negligible effect on the leakage characteristics of the storage capacitor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a storage node of a capacitor having increased charge storage capacity, comprising the steps of:
    a. forming a doped polysilicon region;
    b. depositing a thin layer of hemipherical grain polysilicon having a grain size and film thickness on the same order of magnitude on said doped polysilicon region; and
    c. without masking said thin layer of hemispherical grain polysilicon, etching said doped polysilicon region and said thin layer of hemispherical grain polysilicon using an etch chemistry that etches said doped polysilicon region faster than said thin layer of hemispherical grain polysilicon to increase an upper surface area of said storage node wherein said etching step continues until all of said hemispherical grain polysilicon is removed from said upper surface of said storage node.

2. The method of claim 1, wherein said etch chemistry comprises a halogen etch chemistry.

3. The method of claim 1, wherein said etch chemistry comprises a HBr/Cl$_2$ etch chemistry.

4. The method of claim 1, wherein said step of forming said doped polysilicon region comprises the step of doping polysilicon insitu during deposition.

5. The method of claim 1, wherein said doped polysilicon region is doped with phosphorous.

6. The method of claim 1, wherein said etching step forms U-shaped grooves in an upper surface of said doped polysilicon region.

7. The method of claim 6, wherein said U-shaped grooves have a depth on the order of 0.1–0.3 microns.

8. The method of claim 1, wherein said thin hemispherical grain polysilicon is deposited to a thickness on the order of 500 Å.

9. The method of claim 1, wherein said etching step has a selectivity of at least 3:1 between undoped polysilicon and hemispherical grain polysilicon.

10. A method of forming a memory cell, comprising the steps of:
    a. forming an active area in a semiconductor body;
    b. forming a polysilicon gate extending over said active area;
    c. forming a bitline over and insulated from said polysilicon gate, said bitline being electrically coupled to said active area on a first side of said polysilicon gate; and
    d. forming a first electrode electrically coupled to said active area on a second side of said polysilicon gate by:
        i. forming a doped polysilicon node having sidewalls and an upper surface;
        ii. depositing a thin layer of undoped hemispherical grain polysilicon having a grain size and film thickness on the same order of magnitude on said sidewalls and said upper surface of said doped polysilicon node; and
        iii. without masking said thin layer of hemispherical grain polysilicon etching said doped polysilicon node and said thin layer of hemispherical grain polysilicon with an etch chemistry having a selectivity of at least 3:1 between the doped polysilicon node and the thin layer of undoped hemispherical grain polysilicon, wherein said etching step continues until all of said hemispherical grain polysilicon is removed from said upper surface of said doped polysilicon node;
    e. forming a capacitor dielectric over said first electrode; and
    f. forming a second electrode over said capacitor dielectric such that said first electrode, said capacitor dielectric and said second dielectric form a capacitor.

11. The method of claim 10, wherein said etch chemistry comprises a halogen etch chemistry.

12. The method of claim 10, wherein said etch chemistry comprises a HBr/Cl$_2$ etch chemistry. of said doped polysilicon node.

13. The method of claim 10, wherein said etching step forms U-shaped grooves in said upper surface of said doped polysilicon node.

14. The method of claim 13, wherein said U-shaped grooves have a depth on the order of 0.1–0.3 microns.

15. The method of claim 10, wherein said thin hemispherical grain polysilicon is deposited to a thickness on the order of 500 Å.

* * * * *

UNITED STATES PATENT AND TRADEMARK OFFICE
CERTIFICATE OF CORRECTION

PATENT NO : 5,726,085

DATED : Mar. 10, 1998

INVENTOR(S): Darius Lammont Crenshaw, Rick L. Wise, Jeffrey McKee

It is certified that error appears in the above-identified patent and that said Letters Patent is hereby corrected as shown below:

Title page, item [73], should read--
Assignee:  Texas Instruments Incorporated
           Dallas, Texas Signed and Sealed this Fifteenth Day of December, 1998

Attest:

BRUCE LEHMAN

Attesting Officer

Commissioner of Patents and Trademarks